United States Patent
Cinnamon et al.

(10) Patent No.: US 9,853,593 B2
(45) Date of Patent: Dec. 26, 2017

(54) SOLAR PANEL MECHANICAL CONNECTOR AND FRAME

(71) Applicant: Spice Solar, Inc., Campbell, CA (US)

(72) Inventors: Barry Cinnamon, Saratoga, CA (US); David Baker, Capitola, CA (US)

(73) Assignee: Spice Solar, Inc., Campbell, CA (US)

(*) Notice: Subject to any disclaimer, the term of this patent is extended or adjusted under 35 U.S.C. 154(b) by 417 days.

(21) Appl. No.: 14/325,058

(22) Filed: Jul. 7, 2014

(65) Prior Publication Data

US 2016/0006390 A1 Jan. 7, 2016

(51) Int. Cl.
*H02S 20/23* (2014.01)
*F24J 2/52* (2006.01)
(Continued)

(52) U.S. Cl.
CPC .............. *H02S 20/23* (2014.12); *E04H 14/00* (2013.01); *F24J 2/5245* (2013.01); *F24J 2/5254* (2013.01); *H01L 31/042* (2013.01); *F16B 5/002* (2013.01); *F16B 5/0614* (2013.01); *F24J 2/5205* (2013.01); *F24J 2/5211* (2013.01); *F24J 2/5258* (2013.01);
(Continued)

(58) Field of Classification Search
CPC .......... H02S 20/00; H02S 20/23; H02S 20/24; H02S 30/10; F24J 2/521; F24J 2002/5213; F24J 2/5239; F24J 2/5245; F24J 2/5252; F24J 2/5254; F24J 2/5256; F24J 2/526; F24J 2/5258; F24J 2/5211; F24J 2/5207; F24J 2/5262; F24J 2002/4672; F24J 2002/5226; F24J 2002/4661; F24J 2002/4663; F24J 2/5205; Y02E 10/47; Y02E 10/50; Y02B 10/12; Y02B 10/20; Y02B 10/10; Y02B 10/14

USPC .......... 248/228.1, 231.21, 237, 500, 220.21, 248/222.14, 309.1, 316.1, 316.4; 52/173.3, 489.1; 136/251, 244, 243
See application file for complete search history.

(56) References Cited

U.S. PATENT DOCUMENTS

| | | | | | |
|---|---|---|---|---|---|
| 4,426,999 | A | * | 1/1984 | Evans | ...................... F24J 2/202 126/569 |
| 5,134,827 | A | * | 8/1992 | Hartman | ................. E04D 3/366 126/634 |

(Continued)

FOREIGN PATENT DOCUMENTS

CN 203103317 U 7/2013

*Primary Examiner* — Leslie A Nicholson, III
*Assistant Examiner* — Taylor Morris
(74) *Attorney, Agent, or Firm* — David R. Stevens; Stevens Law Group

(57) ABSTRACT

A bracket for coupling frames of solar panels includes a spacer for positioning between frames. An elongated body passes through a slot in the spacer and is positionable within channels formed in the frames. A clamp secures to the spacer and is biased toward the slot and elongated body, such as by means of a spring. The clamp defines seats for receiving portions of the frames of the solar panels. Sloped portions on end portions of the clamp facilitate insertion of the frames between the elongated body and the clamp. Another type of bracket includes a spacer and clamp, the spacer having protuberances for insertion into channels in the frames. A flange extends from the spacer such that it extends between the frames when the protuberances are positioned within the channels. An L-foot or other fixture may secure to the flange to secure the solar panels to a structure.

16 Claims, 16 Drawing Sheets

(51) Int. Cl.
*E04H 14/00* (2006.01)
*H01L 31/042* (2014.01)
*F16B 5/00* (2006.01)
*F16B 5/06* (2006.01)

(52) U.S. Cl.
CPC .............. *F24J 2/5262* (2013.01); *Y02B 10/12* (2013.01); *Y02E 10/47* (2013.01); *Y02E 10/50* (2013.01)

(56) References Cited

U.S. PATENT DOCUMENTS

| | | | | |
|---|---|---|---|---|
| 6,726,117 B2* | 4/2004 | Herb | ........................ | F16B 37/046 238/315 |
| 7,406,800 B2* | 8/2008 | Cinnamon | .............. | F24J 2/5211 136/244 |
| 7,435,134 B2* | 10/2008 | Lenox | .................... | F24J 2/5245 439/567 |
| 7,592,537 B1* | 9/2009 | West | ........................ | F24J 2/5211 136/251 |
| 7,634,875 B2* | 12/2009 | Genschorek | ............. | F24J 2/045 403/331 |
| 7,694,466 B2* | 4/2010 | Miyamoto | .............. | F24J 2/5207 126/623 |
| 7,814,899 B1* | 10/2010 | Port | ........................ | F24J 2/5211 126/571 |
| 7,856,769 B2* | 12/2010 | Plaisted | .................. | F24J 2/5207 136/244 |
| 8,109,048 B2* | 2/2012 | West | ........................ | F24J 2/5211 126/623 |
| 8,176,693 B2* | 5/2012 | Abbott | .................... | F16B 2/185 52/173.1 |
| 8,505,224 B2* | 8/2013 | Huang | .................... | H02S 30/10 126/704 |
| 8,505,864 B1* | 8/2013 | Taylor | .................... | F24J 2/5258 248/226.12 |
| 8,623,158 B2* | 1/2014 | Stanley | ............... | E04D 13/1407 156/291 |
| 8,763,322 B2* | 7/2014 | Hamamura | ............. | F24J 2/5245 52/173.3 |
| 8,919,075 B2* | 12/2014 | Erickson | .................. | F24J 2/461 52/173.3 |
| 2004/0163338 A1* | 8/2004 | Liebendorfer | ......... | F24J 2/5207 52/173.1 |
| 2009/0025314 A1* | 1/2009 | Komamine | ............ | F24J 2/5207 52/173.3 |
| 2009/0200443 A1* | 8/2009 | Burtscher | .............. | F24J 2/5205 248/316.1 |
| 2009/0230265 A1* | 9/2009 | Newman | ................ | F24J 2/5205 248/229.11 |
| 2010/0065108 A1 | 3/2010 | West et al. | | |
| 2010/0180933 A1 | 7/2010 | Aftanas et al. | | |
| 2010/0206301 A1* | 8/2010 | Aftanas | .............. | C07K 16/2803 126/680 |
| 2010/0275549 A1* | 11/2010 | Bruce | .................... | F24J 2/5205 52/698 |
| 2010/0282290 A1* | 11/2010 | Schwarze | .............. | F24J 2/5205 136/244 |
| 2011/0146763 A1* | 6/2011 | Sagayama | .............. | F24J 2/5207 136/251 |
| 2011/0174353 A1* | 7/2011 | Urban | .................... | F24J 2/5232 136/244 |
| 2011/0194886 A1* | 8/2011 | Wu | ........................ | E06B 3/9641 403/23 |
| 2012/0000513 A1* | 1/2012 | Ben Izhak | ............. | F24J 2/5262 136/251 |
| 2012/0017526 A1* | 1/2012 | Eide | ........................ | H02S 20/30 52/173.3 |
| 2012/0073220 A1* | 3/2012 | Kobayashi | ................ | E04D 1/30 52/173.3 |
| 2012/0102854 A1* | 5/2012 | Meier | .................... | F24J 2/5205 52/173.3 |
| 2012/0234378 A1 | 9/2012 | West et al. | | |
| 2012/0244729 A1* | 9/2012 | Rivera | .................... | F24J 2/4638 439/97 |
| 2012/0255675 A1* | 10/2012 | Sha | ........................ | F24J 2/5207 156/281 |
| 2013/0032200 A1* | 2/2013 | Schnitzer | ............... | F24J 2/5205 136/251 |
| 2013/0091786 A1* | 4/2013 | DuPont | .................. | F24J 2/5249 52/173.3 |
| 2013/0334382 A1 | 12/2013 | Kanczuzewski et al. | | |
| 2014/0102996 A1* | 4/2014 | Pelman | .................. | F24J 2/5233 211/41.1 |
| 2014/0290717 A1* | 10/2014 | Chiu | ........................ | H02S 20/23 136/251 |
| 2015/0101997 A1* | 4/2015 | Liu | ........................ | F24J 2/5258 211/41.1 |
| 2015/0107651 A1* | 4/2015 | Cinnamon | .............. | H02S 40/36 136/251 |
| 2016/0285405 A1* | 9/2016 | Stephan | .................. | H02S 20/20 |

\* cited by examiner

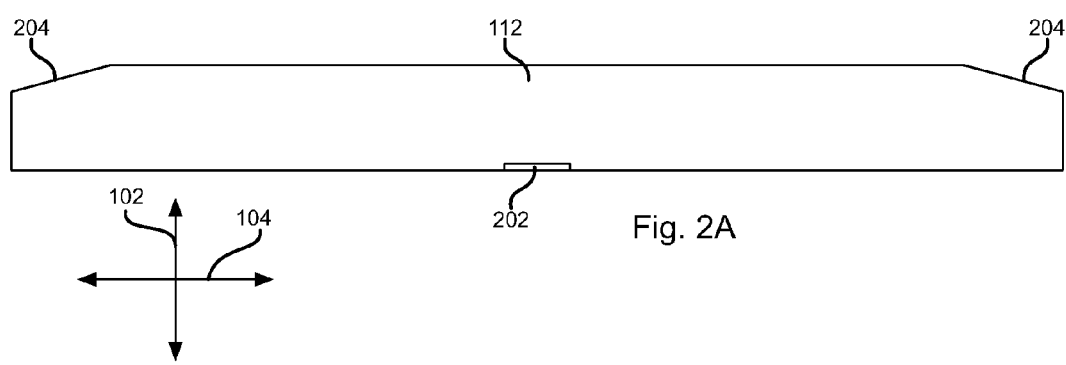
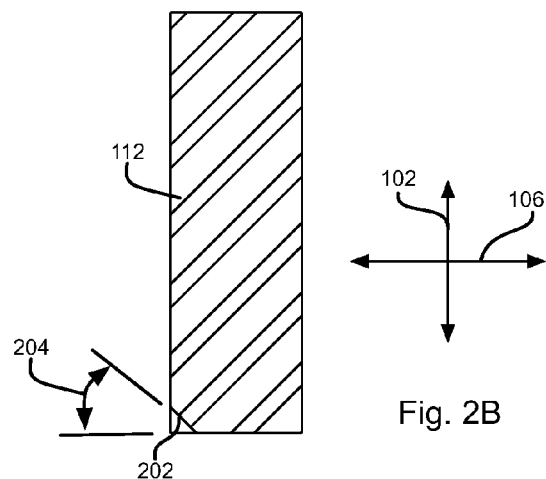

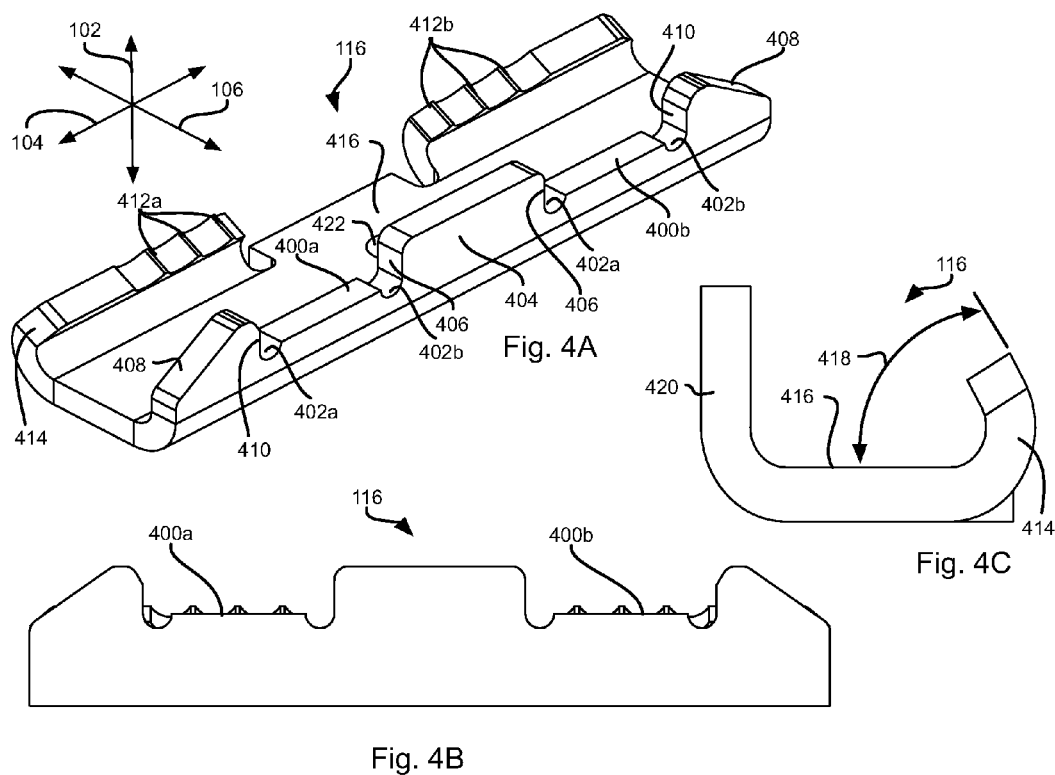

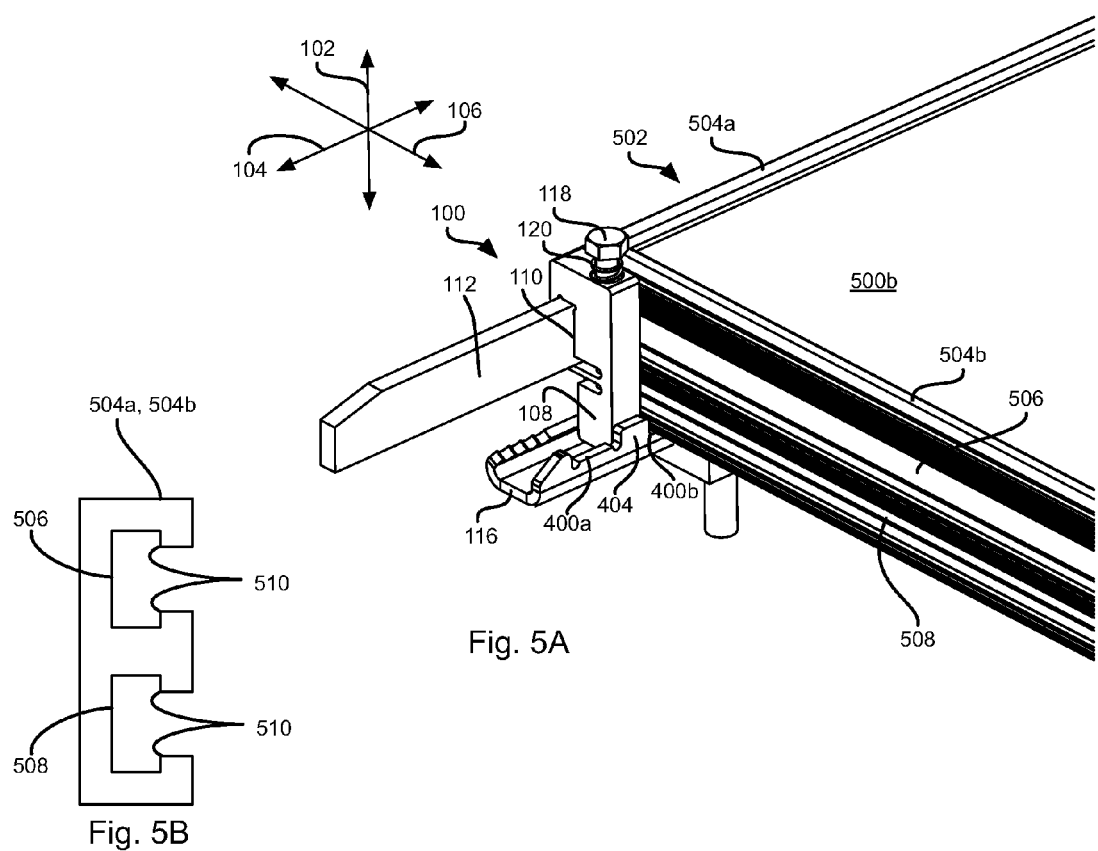

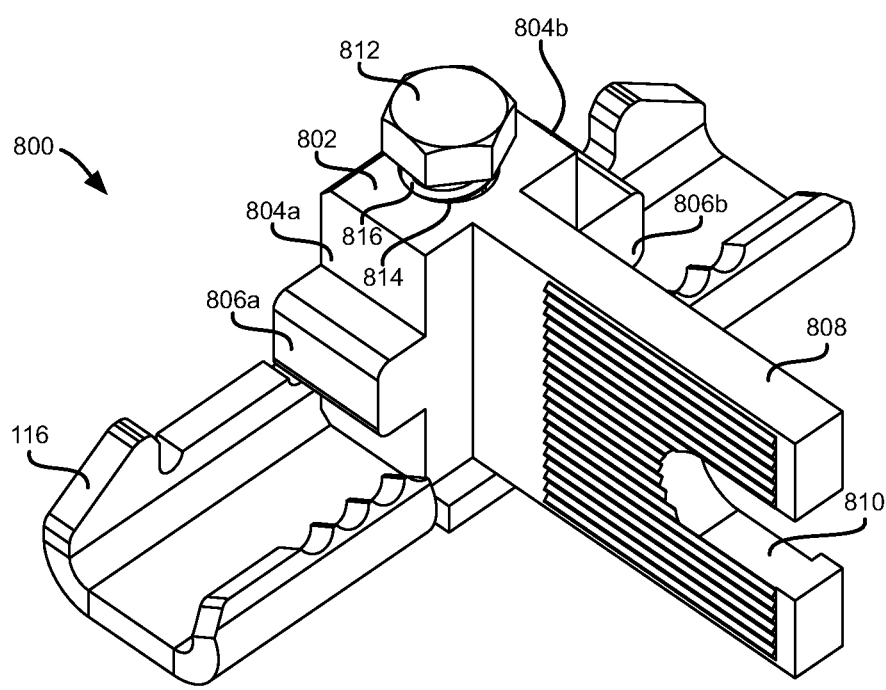
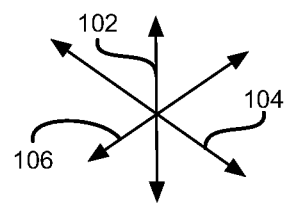
Fig. 8A

SOLAR PANEL MECHANICAL CONNECTOR AND FRAME

BACKGROUND OF THE INVENTION

Recently, concerns over the long-term availability and pollutive effects of traditional energy sources like coal, natural gas, and nuclear power has led to increased interest and development of renewable energy sources. Even more recently, renewable energy sources, which include hydroelectric, wind, solar, geothermal and biomass have been introduced as supplements to traditional energy sources in major business and industry sectors. In some instances, solar powered energy sources have even become the primary energy source for some residences.

Typically, solar power generation for residential establishments involve installing large solar panels on rooftops. These solar panels absorb the solar radiation and convert the absorbed energy into electricity, which can be used to power the residence. However, installation of these panels can be complex and/or difficult due to their size. Generally, a mounting system is first installed, and secured against specific locations (e.g., against rafters). A series of rails are then put in place in the mounting system (typically in a grid-like arrangement). The solar panels themselves are then securely affixed to the rails and, eventually, to neighboring panels via mechanical and/or electrical connectors.

However, the railing system presents additional expenditures due to materials and transport costs of the rails themselves. As a solution to this, solar panels were developed that were capable of being installed directly to mounting systems without the need for rails. In order to maintain the same stability and security, the solar panels are mechanically affixed to each other (typically in series), using a mechanical connectors, sometimes implemented as cylindrical rods or trapezoidal beams. Generally, these connectors consist of rigid, threaded connectors, often positioned in short tunnels within the interiors of frames of two neighboring rectangular panels. The connectors are inserted into a first panel, and then to a second panel on the opposite end of the splice. Initially, the connectors protrude into each panel insecurely. Subsequently, the connectors may be manually tightened to both panels—often in a user-intensive process—which increases the rigidity of the connection. However, according to such a solution, the connectors are generally very difficult to access while the panels are in position.

Thus, while obviating the requirement for rails, this solution presents significant problems of its own. Specifically, panel removal can become exceedingly difficult, particularly in the case of "middle" or non-end panels in a grid or panel array. Since there is generally only a small amount of space between neighboring panels, there is often insufficient clearance to completely disengage a splice from the panel to be removed. Moreover, specialized tools are commonly required to insert the splices or other connectors. As such, removal of a specific target panel may actually require the initial removal of several intervening panels in the same row or column (or other orientation). Naturally, this is both an inefficient and extremely time-consuming process.

Another conventional solution has been proposed that positions the connectors along the exterior of the frame, with the connectors being capable of being moved along the perimeter in a single grooved channel. However, the channel is also used to affix each panel to mounting points of the mounting system. Thus, movement of the connectors is limited to the lengths of the frames between mounting points. The limited mobility can present problems during removal themselves.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

In one aspect of the invention, an article of manufacture is disclosed for use in a solar panel installation having at least first and second solar panels. Each solar panel may include a frame encircling a perimeter of the solar panel and a first channel disposed along a portion of the frame. The channel may be configured to affix the solar panel to one or more mounting points. A second channel may be disposed along one of an internal and external surface of the frame and be configured to retain a widened portion of a fastener positioned within the channel. The article may include an elongated body having a first end, and a second end opposite the first end, each of the respective first and second ends being shaped to match a configuration of the second channel and to be received and retained in the second channel of the respective first solar panel and the second solar panels.

A spacer defines opposing surfaces for engaging the first and second solar panels and a slot. The elongated body is positioned within the slot. A clamp is secured to the spacer and defines first and second seats each configured to receive a lower portion of the frames of the first and second solar panels, respectively.

In another aspect of the invention, the article of manufacture includes spacer defining opposing surfaces for engaging the first and second solar panels. The spacer further includes a first protuberance configured to insert into the first channel of the first solar panel and a second protuberance configured to insert into the first channel of the second solar panel. A flange extends between the first and second solar panels and is positioned to extend between the first and second solar panels when the first protuberance is inserted within the first channel. The flange further defines an aperture for receiving a fastener engaging one of the first channel and the second channel of one or more of the first and second solar panel. A clamp is secured to the spacer and defines first and second seats each configured to receive a lower portion of the frames of the first and second solar panels, respectively.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which:

FIGS. 2A and 2B are views of a splice in accordance with an embodiment of the present invention;

FIGS. 4A through 4C are views of a clamp in accordance with an embodiment of the present invention;

FIG. 5A is an isometric view of the east-west bracket secured to a solar panel in accordance with an embodiment of the present invention;

FIG. 5B is a cross-sectional view of a solar panel frame suitable for use in accordance with an embodiment of the present invention;

FIG. 8A is an isometric view of a north-south bracket in accordance with an embodiment of the present invention;

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

Figure 1:
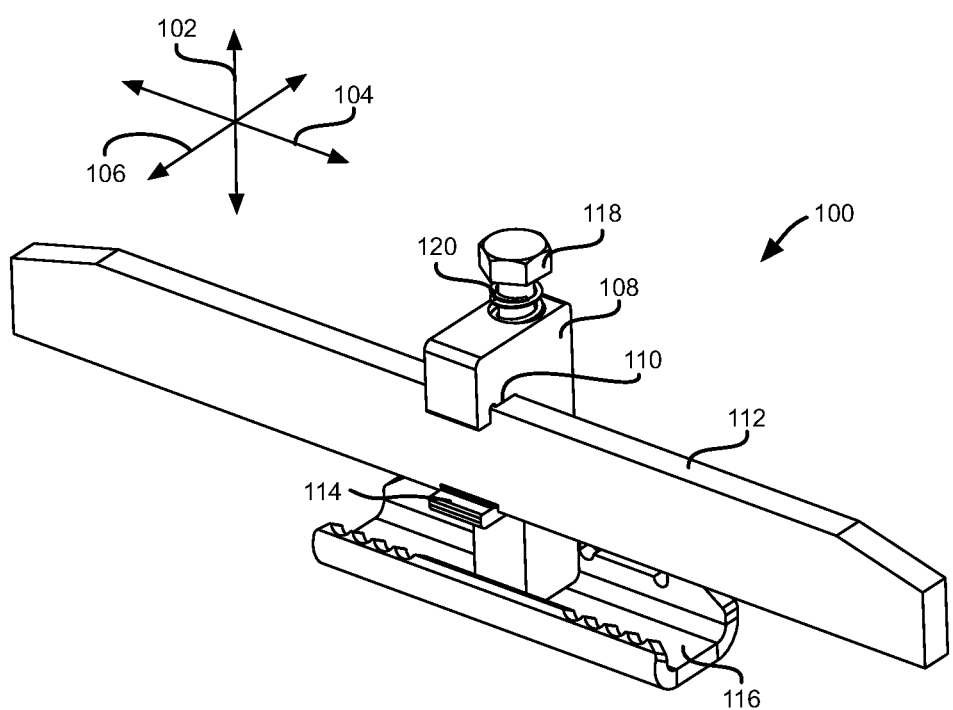
FIG. 1 is an isometric view of a east-west bracket in accordance with an embodiment of the present invention.

Referring to FIG. 1, solar panels, such as solar panels secured to a rack in accordance with prior racking systems, may be coupled to one another without the use of a rack using the illustrated east-west bracket 100. Other solar panels may also be used with the illustrated coupler 100.

The coupler 100 may be understood with respect to the illustrated directions including a vertical direction 102, a horizontal direction 104 perpendicular to the vertical direction 102, and a longitudinal direction perpendicular to the vertical and horizontal directions 102, 104. The vertical direction 102 may generally correspond to absolute vertical, i.e. the direction of action of gravity. The horizontal direction 104 may generally correspond to an east-to-west and west-to-east direction. The longitudinal direction may generally correspond to a north-to-south and south-to-north direction. In most applications in the northern hemisphere, solar panels are mounted on a south facing surface and arrayed in one or both of an east-west direction and a north-south direction.

However, the illustrated directions 102, 104, 106 are to facilitate the description of the relative positions of parts and features of the invention and =unless so indicated are not to be understood in the description or claims as aligned with actual vertical, horizontal, and longitudinal directions.

The east-west bracket 100 may include a spacer 108 defining lateral surfaces for engaging solar panels on either side of the spacer 108. For example, surfaces of the spacer 108 offset from one another in the horizontal direction 104 may be parallel to one another and provide a flat or contoured surface for engaging a frame of a solar panel.

The spacer 108 may define a slot 110 passing completely therethrough in the longitudinal direction and receiving a splice 112. The slot 110 may define a constant cross section in the horizontal direction 104 in order to facilitate sliding of the splice 112 through the slot. The splice 112 may be securable within the slot 110, such as by means of a screw, bolt, pin, or other fastener engaging the splice 112 and spacer 108. In the illustrated embodiment, a lip 114 formed on the spacer engages the splice 112 and resists removal thereof unless moved by application of force.

A clamp secures to the spacer 108, such as located below the slot 110 in the vertical direction 102. As shown the clamp 116 extends outwardly on either side of the spacer 108 in the horizontal direction 104. The clamp 116 may have a U-shaped or concave cross section defining a channel along some or all of the length thereof in the horizontal direction 104 and a portion of the spacer 108 may insert within this channel.

The clamp 116 may secure to the spacer 108 by means of a bolt 118 passing through the spacer 108 and engaging the clamp. In the illustrated embodiment, the bolt includes a head positioned above the spacer 108 in the vertical direction 102 and a threaded portion protruding below the spacer 108 in the vertical direction 102. The threaded portion may engage a threaded aperture in the clamp 116. A spring 120 positioned between the spacer and the head of the bolt 118 may urge the bolt 118 upwardly in vertical direction 102 and thereby urging the clamp 116 upward toward the spacer.

Other configurations may also be used to urge the clamp 116 toward the spacer 108. For example, the bolt 118 may insert through an aperture in the clamp 116 and threadably engage the spacer 108. The spring 120 may be inserted between the head of the bolt 118, or a nut threaded on the bolt 118, and the clamp 116 in order to urge the clamp 116 toward the spacer 108. Likewise, rather than using a bolt 118 or threaded engagement with a bolt, other fastening means may also be used to secure the clamp 116 to the spacer 108, such as a screw, lynch pin, detent, or some other fastener.

Referring to FIGS. 2A and 2B, splice 112 may have some or all of the illustrated attributes. In general, the splice 112 has a width in the horizontal direction 104 many times greater than dimension of the splice 112 in the vertical and longitudinal directions 102, 104. For example, the width in the horizontal direction 104 may be between three and ten times, preferably between five and ten times greater than dimensions of the splice 112 in the vertical direction 102.

The splice 112 may also be taller in the vertical direction 102 than it is deep in the longitudinal direction 106, such as between two and four times taller, in order to support stresses in a vertical plane (i.e., in the vertical and horizontal directions 102, 104).

The splice 112 may define a notch 202, such as extending across a center of the splice 112 in the horizontal direction 104. In particular, a horizontal edge of the splice 112 may be beveled at an angle 204, e.g. between 40 and 60 degrees, such as 45 degrees in the illustrated embodiment. The angle 204 may correspond to an angle defined by the lip 114 and the lip 114 may seat within the notch 202 when the splice 112 is positioned within the slot 110. The lip 114 may define an angle 204 corresponding to the angle 204 of the notch 202 in order to seat within the notch 202 or may have a different angle 204.

Figure 3:
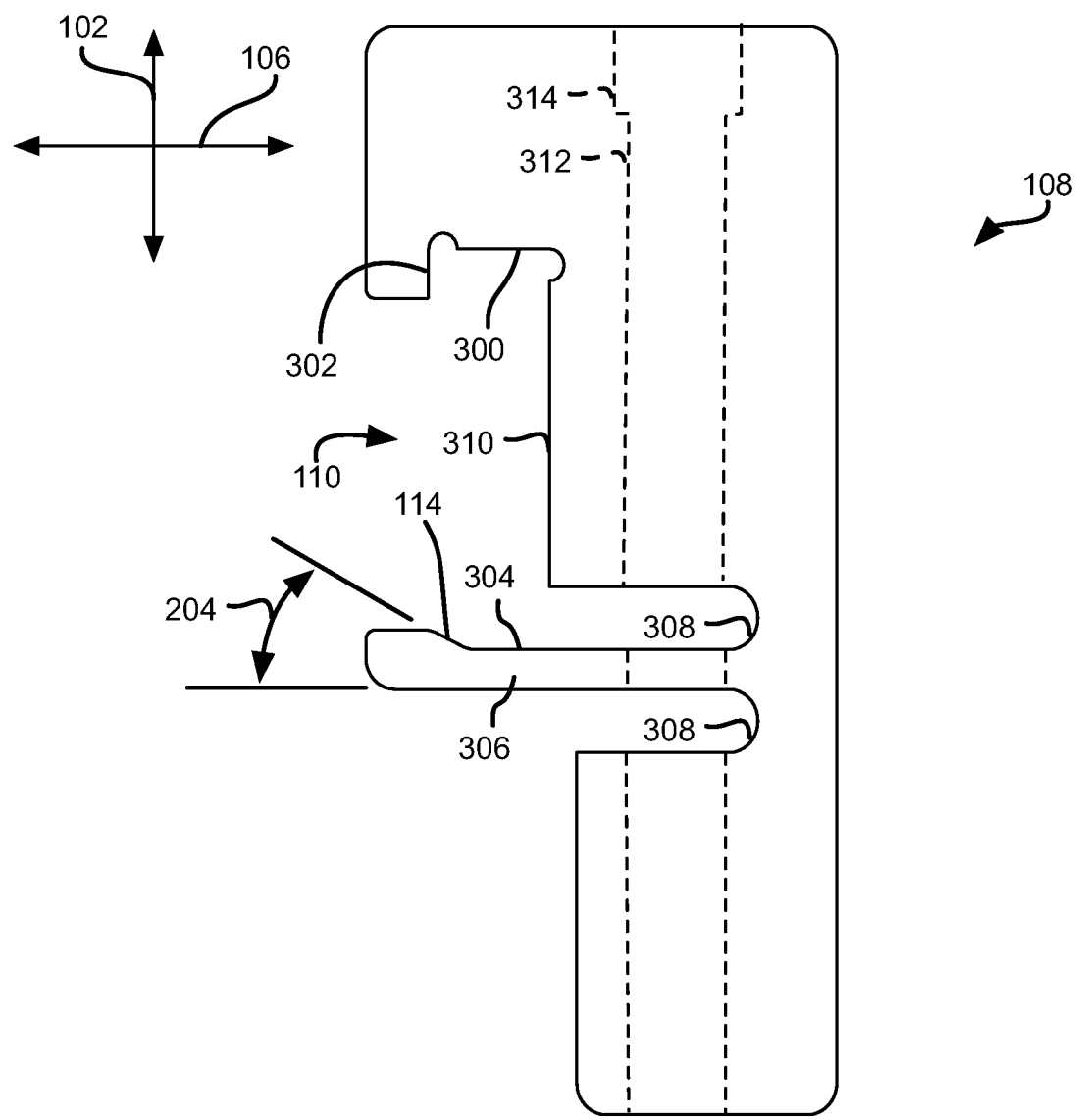
FIG. 3 is a side elevation view of a spacer in accordance with an embodiment of the present invention.

Referring to FIG. 3, a spacer 108 may have the illustrated geometry. For example, the slot 110 defined by the spacer 108 may define an upper slot surface 300 having a lip 302 extending downwardly from a distal end thereof and a lower slot surface 304 vertically below the upper slot surface 300 and having the lip 114 defined at a distal end thereof. The splice 112 is sized to insert freely into the slot 110 between the upper and lower surfaces 300, 304. The lips 302, 114 prevent removal of the splice 112 from the slot 110 in the longitudinal direction 106.

The lower surface 306 may be defined on a flexible flange 306 that has a thickness and or material that permits flexing of the flange 306 without breaking. For example, as shown in FIG. 3, cutouts 308 within the body of the spacer 108 extend the length of the flange 306 beyond the interior wall 310 of the slot 110 in the longitudinal direction 106. For example, the depth of the cutouts 308 beyond the interior wall 310 may be equal to or greater than the depth in the longitudinal direction of the slot 110 to the interior wall 310 as measured from the opening of the slot 110 (e.g. the leftmost surface of the spacer in FIG. 3).

The geometry of the flange 306 may be defined by the force required to urge the lip 114 out of engagement with the notch 202 sufficient for the splice 112 to slide longitudinally within the slot 110, responsive to a longitudinal force exerted without the use of tools, such as a force of from three to five pounds. To enable longitudinal sliding of the splice 112 within the slot 110 responsive to this longitudinal force, the amount of vertical force required to be exerted on the flange 306 and deflect the flange 306 to achieve this slidability may require the use of a tool or may be performed manually. For example, the amount of vertical force to achieve the above-noted longitudinal force required for sliding may be from two to ten pounds.

FIG. 3 further illustrates an aperture 312 extending vertically through the spacer 108 for receiving the bolt 118. The aperture 312 may intersect the flange 306 or be horizontally offset therefrom. In the illustrated embodiment, the aperture 312 defines a countersunk portion 314 at the upper end thereof and the spring 120 seats within the countersunk portion 314. The vertical depth of the countersunk portion 314 may be any depth needed to accommodate a given spring geometry as needed to provide a desired amount of clamping force by the clamp 116. For example, absent any extending force urging the clamp 116 away from the spacer 108, the force exerted on the clamp by the spring 120 may be from 0.5 to two pounds of force. FIGS. 4A through 4C illustrate an example configuration for a clamp 116. The clamp 116 may define one or more seats 400a, 400b sized and shaped to receive a portion of a frame of a solar panel, such as the lower edge, a lateral surface, upper edge, or some other portion of a solar panel. In the illustrated embodiment, two seats 400a, 400b are shown that are positioned on either side of the spacer 108 (see FIG. 1). However, in some embodiments, a single seat 400a may be used such that the presence of the spacer 108 maintains separation between solar panels, rather than the separation between separate seats 400a, 400b.

The shape of the seats 400a, 400b may conform to geometry of the portion of the frame inserted therein. For example, the seats 400a, 400b may be rectangular grooves extending in the longitudinal direction 306. In the illustrated embodiments, indentations 402a, 402b in the corners of the seats 400a, 400b may accommodate corresponding ridges on a lower edge of a frame.

In the illustrated embodiment, a flange 404 is positioned horizontally between the seats 400a, 400b and sides of the flange 404 may be interior walls 406 of the seats 400a, 400b. The flange 404 may extend vertically upward between solar panels inserted within the seats 400a, 400b and maintains separation between the seats 400a, 400b. The horizontal width of the flange 404 may be greater than or smaller than the horizontal width of the spacer 108 such that either of the flange 404 and the body of the spacer 108 maintains separation between the solar panels positioned within the seats 400a, 400b.

The clamp 116 may advantageously facilitate toolless engagement with a frame. In particular, sloped portions 408 may be positioned outward from the seats 400a, 400b in the horizontal direction 104. As shown the sloped portions 408 slope downward in the vertical direction 102 with distance from the center of the clamp 116. In this manner responsive to a horizontal force urging the east-west bracket against a frame, the sloped portions 408 guides the clamp 116 over the frame such that the frame can engage one of the seats 300a, 300b. The sloped portions 408 may extend from distal ends of the clamp 116 to an outer wall 410 of the seats 400a, 400b. As illustrated, transitions between the slopes portions 408 and the wall 410 may be rounded.

The clamp 116 may include one or more scoring portions 412a, 412b positioned to contact portions of frames inserted within the seats 400a, 400b. Specifically, in some applications, the frames may be coated with paint, anodization, or some other coating. These coatings may be non-conductive. Accordingly, the scoring portions 412a, 412b may be positioned to penetrate these coatings when frames are positioned within the seats 400a, 400b. In this manner, the clamp 116 may establish an electrical grounding connection between panels secured to one another. The scoring portions 412a, 412b may be any sharpened structures that can readily penetrate a coating. For example, the scalloped portions shown in FIG. 4A may be used. As shown in FIG. 4B, the scoring portions 412a, 412b extend higher than a lower surface of the seats 400a, 400b in the vertical direction 102 such that the scoring portions 412a, 412b will penetrate into frames inserted within the seats 400a, 400b.

Referring specifically to FIG. 4C, in the illustrated embodiment, the clamp 116 may be formed from an originally flat piece of material that is bent on either side to form the sloped portions 408 and spacer 404 on one side and the scoring portions 412a on an opposite side. For example, a piece of metal may be bent to include a flange 414 and a flange 420 on either side of a middle portion 416, that may be planar or rounded. In the illustrated embodiment, the planar middle portion 416 protrudes longitudinally between the scoring portions 412a, 412b, which may advantageously enable seating of a flat lower surface of the spacer 408 between the scoring portions 412a, 412b.

The scoring portions 412a, 412b may be formed on the flange 414 and the sloped portions 408, seats 400a, 400b, and flange 404 may be defined by the flange 420. In the illustrated embodiment, the flange 414 is bent at an acute angle 418 with respect to the horizontal direction, such that corners of the plate of material forming the clamp 116 point upwardly as shown thereby providing a sharpened structure that may be further sharpened by forming the illustrated scallops.

In the illustrated embodiment, the clamp 116 defines an aperture 422 (FIG. 4A) that may be smooth or threaded for receiving a portion of the bolt 118. In the illustrated embodiment, the aperture 422 is defined in the planar middle portion 416 of the clamp 116.

Figure 5C:
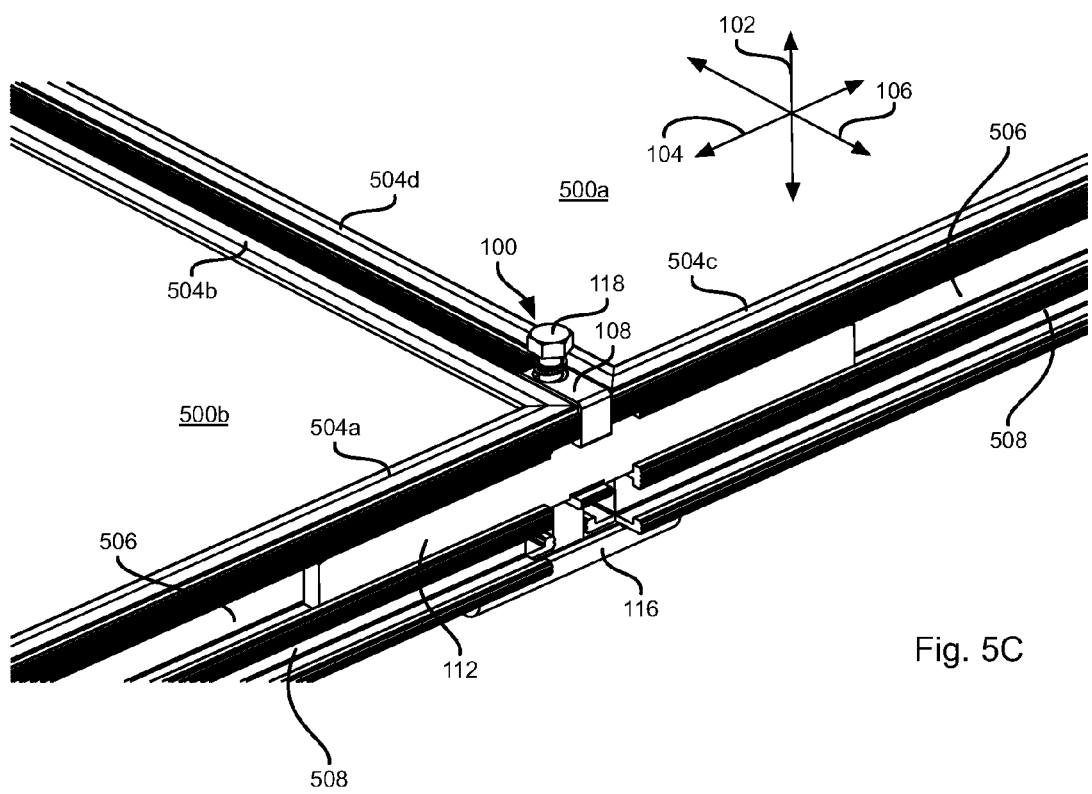
FIG. 5C is an isometric view of the east-west bracket coupling solar panels to one another in accordance with an embodiment of the present invention.

FIGS. 5A through 5E illustrate a east-west bracket in use with solar panels. Referring specifically to FIG. 5A, when installed, a frame 502 of a solar panel 500b, for example, secures to east-west bracket as illustrated. For example, a portion of the splice 112 protruding from one side of the spacer 108 inserts within a channel defined in a portion 504a of the frame 502. For example, the frame portions 504a, 504b may define one or more channels 506, 508 having outer lips 510 that create an opening that has a height in the vertical direction 102 that is less than the height of the channels 506, 508. The illustrated configuration of the slots 506, 508 are used in prior approaches to receive a head of a nut such that the lips 510 resist removal of the head of the nut and allow sliding within the slots 506, 508. The splice 112 may advantageously be sized to fit within such existing channels 506, 508. However, other configurations may also be used. For example, the illustrated channels 506, 508 have an opening extending along the lengths of the frame portions 504a, 504b. However, the splice 112 only inserts at the ends of one of the channels 506, 508, accordingly, the channels 508 may only be open at the corners rather than further including an opening along the entire length thereof as shown.

As shown in FIG. 5A, the east-west bracket 100 secures to the frame 502 by capturing a portion of the frame 502 between the splice 112 and the clamp 116. As shown, a lower edge of the frame portion 504b inserts within one of the seats 400b of the clamp 116 and the splice 112 inserts within one of the channels 506, 508 of a frame portion 504a that is perpendicular to frame portion 504b.

Figure 5D:
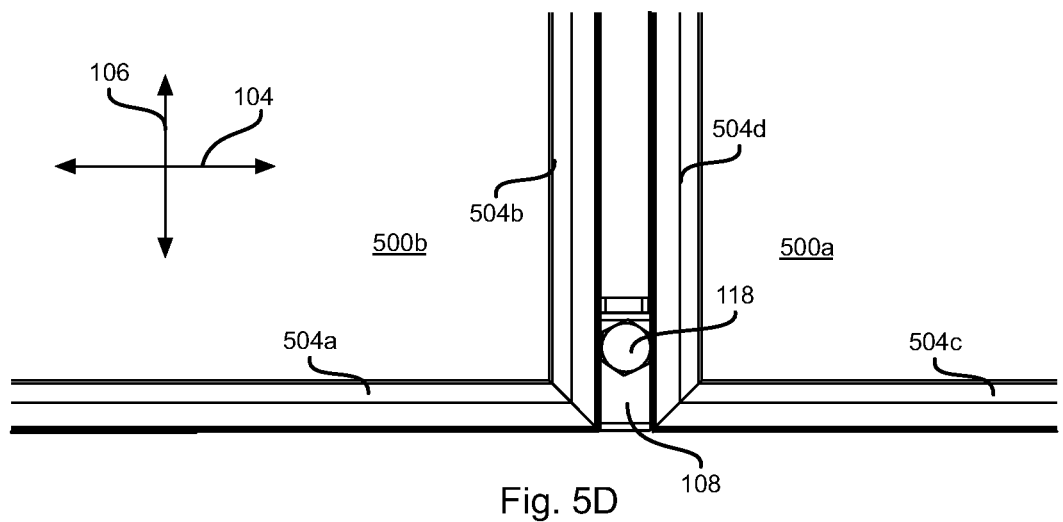
FIG. 5D is a top view of the east-west bracket in accordance with an embodiment of the present invention.

Referring to FIGS. 5C and 5D, a second solar panel 500a may engage an opposite side of the splice 112 and seat within the seat 400a in a mirrored arrangement to that shown for the illustrated solar panel. As shown, the spice 112 inserts within the channel 506 of frame portion 504c of the solar panel 500a. As is readily apparent the spacer 108 maintains a separation between the solar panels 500a, 500b, such as between the illustrated frame portions 504b, 504d, the frame portion 504d being perpendicular to frame portion 504c. The separation between the panels 500a, 500b may enable access to wiring coupling solar panels 500a, 500b to one another. In some embodiments, when engaged with the solar panels 500a, 500b, the east-west bracket 100 may permit some movement of the solar panels relative to one another to further facilitate access to wiring or to align panels more precisely on an uneven roof surface. For example, the east-west bracket 100 may permit shifting of one or both of the solar panels 500a by 1 mm or more without decoupling the east-west bracket 100.

Figure 5E:
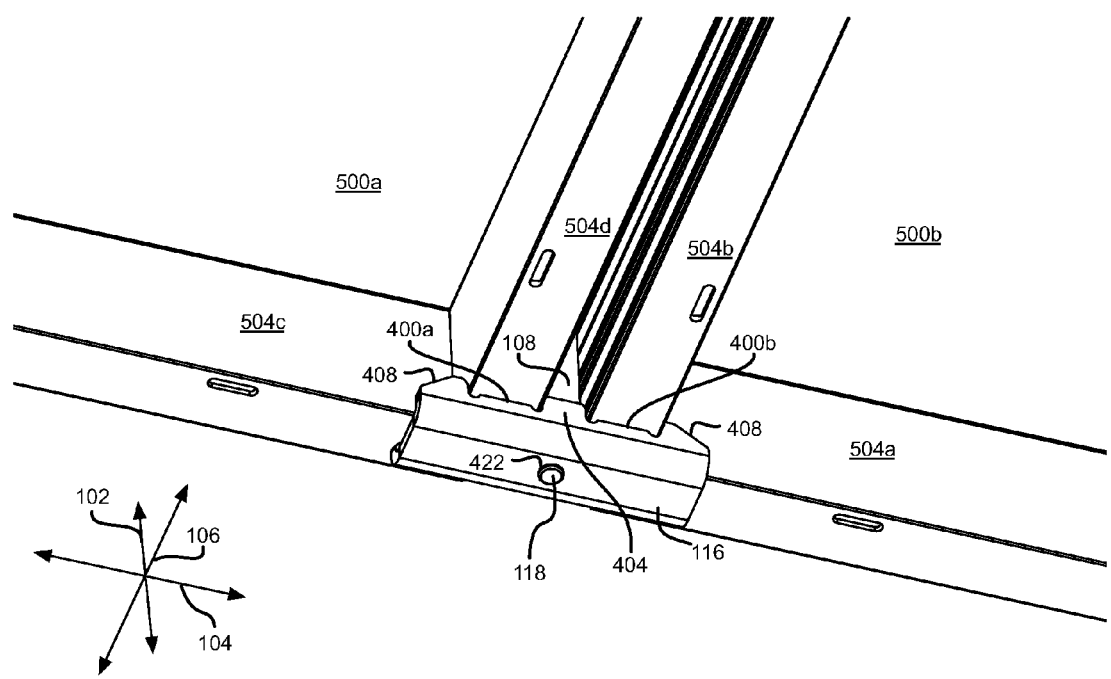
FIG. 5E is a lower isometric view of the east-west bracket coupling solar panels to one another in accordance with an embodiment of the present invention.

Referring to FIG. 5E, as noted above, the bolt 118 may engage the aperture 422 in the clamp 116 in order to urge the clamp 116 against the frame portions 504b, 504d as shown. In particular, the spring 120 may urge the clamp 116 into engagement with the frame portions 504b, 504d in a biased manner that can be easily overcome. By tensioning the bolt 118, the pressure exerted on the clamp 116 is increased effective to prevent removal of the solar panels 500a, 500b from engagement with the east-west bracket 100 without deforming the frames thereof or the clamp 116.

Figure 6:
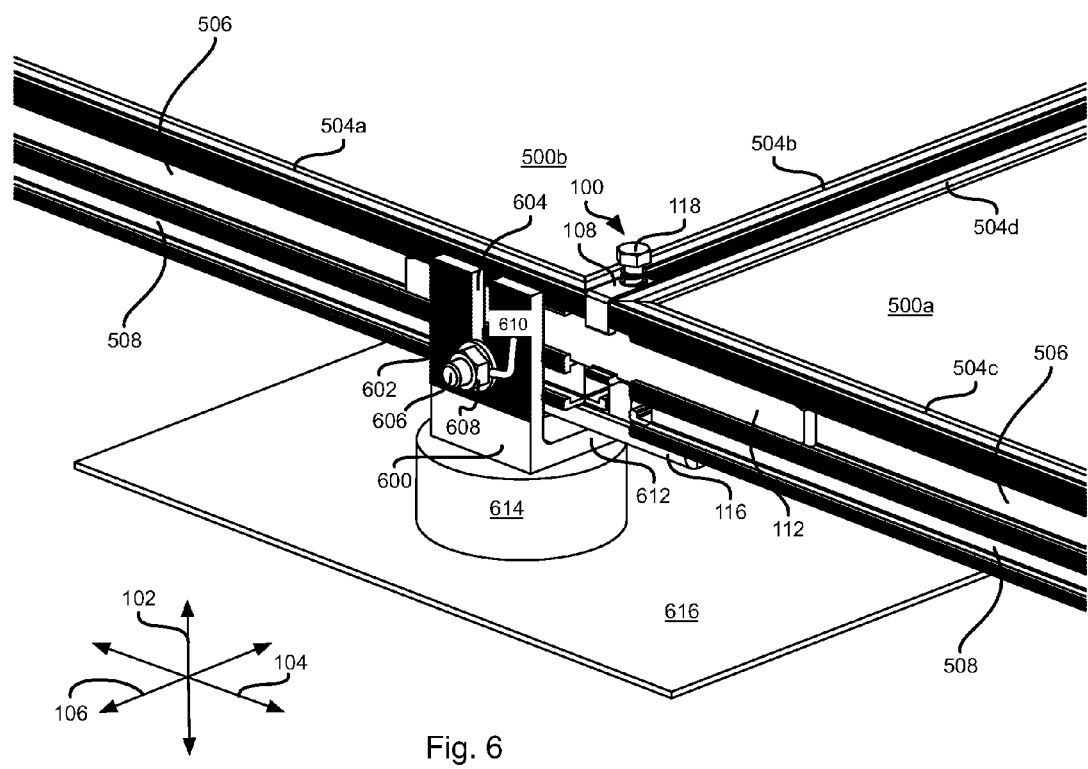
FIG. 6 is an isometric view of the east-west bracket and a roof mounting fixture in accordance with an embodiment of the present invention.

Referring to FIG. 6, two or more solar panels coupled together by one or more east-west brackets 100 may be further mounted to a supporting structure, such as the roof of a building, a dedicated platform, or the like. The east-west bracket 100 advantageously secures adjacent solar panels 500a, 500b to one another and eliminates the need for a separate rack on which to mount the panels 500a, 500b. Accordingly, the solar panels 500a, 500b may also be secured to a supporting structure without a rack. For example, an L-foot 600 may define an upper flange 602 including a slot 604 or aperture. A bolt 606 is positioned having the head thereof in one of the channels 506, 508 of one of the frame portions 504a, 504d. The bolt 606 may pass through the slot 604 and engage a nut 608 that may be tensioned to secure the flange 602 to one of the solar panels 500a, 500b. A washer 610 may be positioned between the nut 608 and the upper flange 602. In the illustrated embodiment, the splice 112 is positioned within the upper channel 506 of frame portion 504a and the head of the bolt 606 is positioned within the lower slot 508 thereof. In this manner, the possible locations for the L-foot 600 are not limited by the splice 112. In many applications, the L-foot 600 must be placed over a rafter or other structure that is fixed. Accordingly, flexibility in the placement of the L-foot 600 is desirable.

A lower flange 610 of the L-foot 600 may rest on a spacer 614 that itself rests on some other structure 616. The structure 616 may be shingles, tiles, or other roof covering or may be flashing or panels placed over such a covering in order to support the solar panels 500a, 500b. A lag bolt or some other fastener, may pass through the lower flange 612 of the L-foot 600, the spacer 614, and structure 616 to engage a rafter or some other support structure. The slot 604 may be disposed with respect to the lower flange 612 such that when the lower flange 612 is positioned underneath the clamp 116 and the flange 602 is fastened to the frame portion 504a, the lower flange 612 still provides clearance for the clamp 116 to move out of engagement with the frame portions 504a, 504c without removing the L-foot 600 from the frame portions 504a, 504c.

Figure 7A:
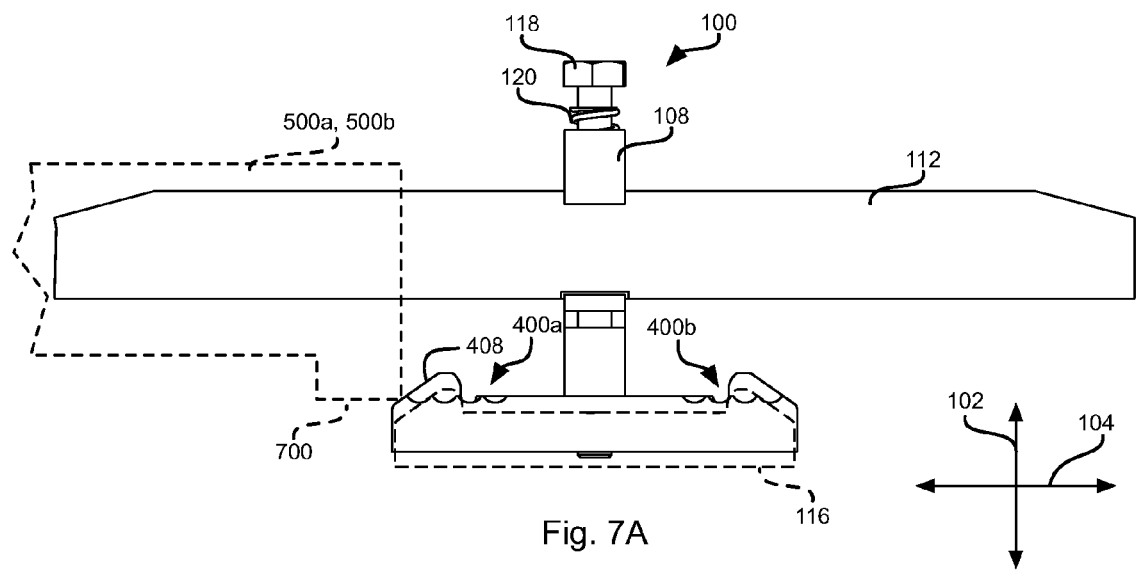
FIGS. 7A and 7B are front views of the east-west bracket showing a process of securing a solar panel in accordance with an embodiment of the present invention.

Referring to FIG. 7A, in use a solar panel 500a 500b and east-west bracket 100 may be brought together either by moving the east-west bracket 100 into engagement with a solar panel 500a, 500b or by moving a solar panel 500a, 500b into engagement with an east-west bracket 100, such as an east-west bracket 100 that is already engaged with another solar panel 500a, 500b. The relative movement of the solar panel 500a, 500b or east-west bracket 100 may be generally in the horizontal direction 104 (e.g. within +/−5 degrees from the horizontal direction).

As the solar panel 500a, 500b and east-west bracket 100 are brought together, a portion 700 of the solar panel 500a, 500b (e.g. a lower edge of a frame portion 504b, 504d) contacts a sloped portion 408 of the clamp 116, which urges the clamp 116 downwardly, as shown by the dotted representation of the clamp 116. Urging the clamp 116 downwardly draws the bolt 118 downwardly, compressing the spring 120.

Figure 7B:
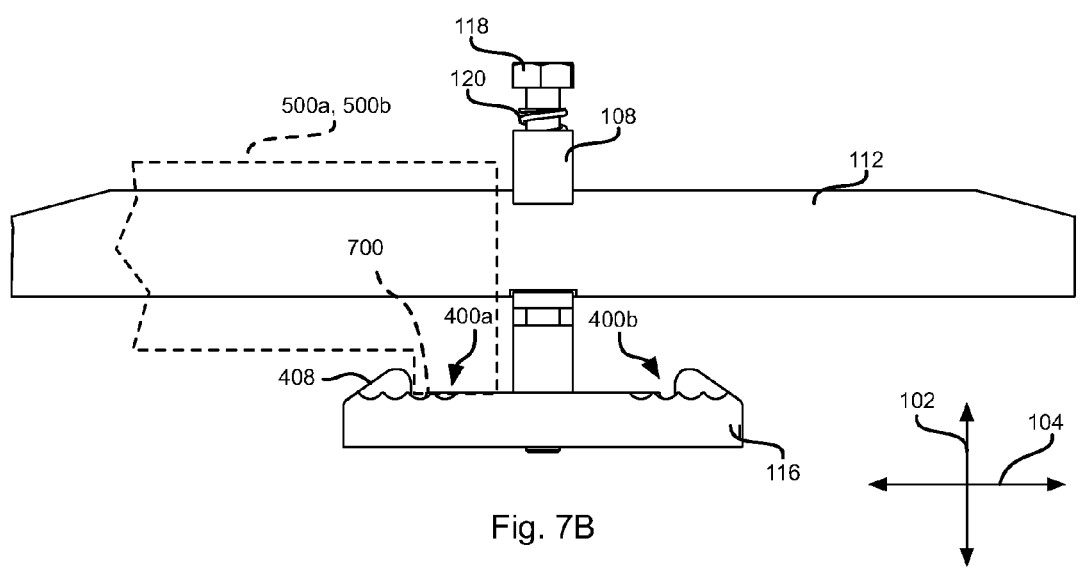

As shown in FIG. 7B, as the portion 700 moves past the sloped portion 408 and over one of the seats 400a, 400b, the biasing force of the spring 120 urges the clamp 116 upward such that the portion 700 is urged into the seat 400a, 400b by the biasing force. The seating of the portion 700 into the seat 400a, 400b may advantageously produce an audible click the enables a user to verify that seating has occurred.

Figure 8B:
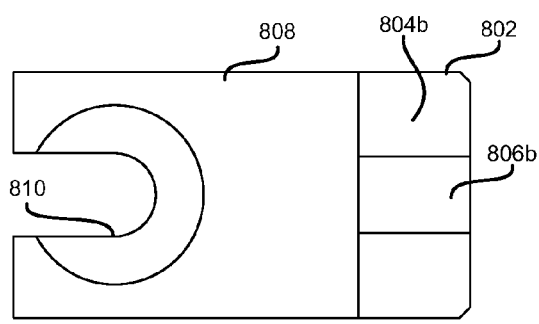
FIGS. 8B and 8C are views of a spacer for a north-south bracket in accordance with an embodiment of the present invention.

The bolt 118 may then be tensioned in order to further press against the portion 700. The bolt 118 is advantageously oriented in the vertical direction 102 and exposed from above enabling easy access. As shown in FIGS. 5A through 5D, bringing the east-west bracket 100 into engagement with the solar panel 500a, 500b may include urging a portion of the splice 112 into engagement with one of the channels 506, 508. Accordingly, tensioning of the bolt 118 pinches a portion of the solar panel 500*a*, 500*b* between the clamp 116 and channel splice 112 and resists separation of the east-west bracket 100 and the solar panel 500*a*, 500*b*. Tensioning of the bolt 118 may be performed after bringing two solar panels 500*a*, 500*b* into engagement with the east-west bracket as shown in FIGS. 5C through 5E. Bringing a second solar panel into engagement with the east-west bracket may be performed in a mirrored fashion to what is shown in FIGS. 7A and 7B Referring to FIGS. 8A through 8C in some embodiments a north-south bracket 800 may also secure solar panels together. It is contemplated that the north-south bracket 800 will be used to fasten solar panels together that are oriented in a north-south direction. However, the north-south bracket 800 may also be used to couple solar panels together that are aligned with one another in the east-west or other direction. In some embodiments, solar panels may be arranged in a two-dimensional array oriented in any arbitrary direction. East-west running edges (or edges oriented in some first direction) may be secured to one another with the north-south bracket 800 and the north-south running edges (or edges oriented perpendicular to the first direction) may be secured to one another using the east-west bracket 100, or vice-versa.

The north-south bracket 800 may include a spacer 802 defining opposing faces 804*a*, 804*b* that may be both flat and parallel to one another. The faces 804*a*, 804*b* may conform to surfaces of solar panels fastened using the north-south bracket 800. In the illustrated embodiment, the faces 804*a*, 804*b* extend in a plane parallel vertical and horizontal directions 102, 104. Protuberances 806*a*, 806*b* project outwardly from the surfaces 804*a*, 804*b* in the longitudinal direction 106. In this manner, the protuberances 806*a*, 806*b* may be positioned in one of the channels defined in the frames of solar panels fastened using the north-south bracket 800.

The spacer 802 may further define a flange extending outwardly from the spacer 802 in the horizontal direction. The flange may define a slot 810, aperture, or some other structure for receiving a fastener. In the illustrated embodiment, the slot 810, aperture, or other structure extends through the flange 810 in the longitudinal direction 106. The flange 808 may be taller in the vertical direction 102 than it is thick in the longitudinal direction 106, e.g. between three and five times taller. Likewise, the flange 808 may be longer in the horizontal direction 104 than it is thick, e.g. between five and ten times. The length in the horizontal direction 104 may also be greater than the height in the vertical direction 102, e.g. between one and two times longer.

Figure 8C:
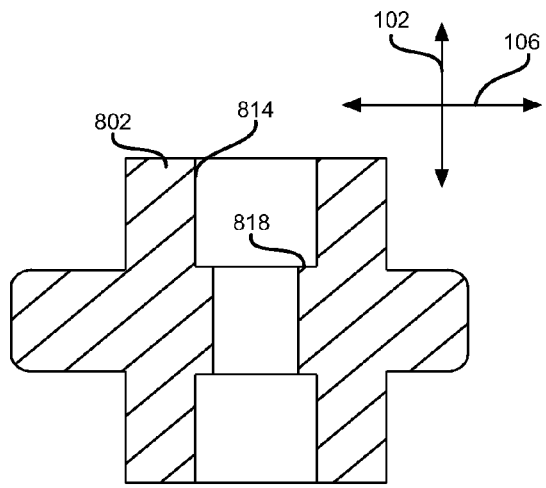

A bolt 812 may pass through an aperture through the spacer 802 and engage a clamp 116. A spring 814 may be interposed between a head of the bolt 812 and the spacer 802 in order to urge the bolt 812 and clamp 116 upward, such as in the same manner as for the east-west bracket 100. As shown in FIG. 8C, the aperture 814 may include a countersunk portion 818 that engages the spring 814.

Other configurations may also be used to urge the clamp 116 toward the spacer 802. For example, the bolt 812 may insert through an aperture in the clamp 116 and threadably engage the spacer 802. The spring 816 may be inserted between the head of the bolt 812, or a nut threaded on the bolt 812, and the clamp 116 in order to urge the clamp 116 toward the spacer 108.

As shown in FIG. 8A, the clamp extends on either side of the spacer 802 in the longitudinal direction. The clamp 116 may have some or all of the attributes of the clamp 116 for the east-west bracket 100 described above. Likewise, the clamp 116 may be brought into engagement with the frames of solar panels in the same manner as describe above with respect to FIGS. 7A and 7B. Likewise, the bolt 812 may be tensioned in order to fasten the clamp 116 and spacer to one or more solar panels in the same manner as described above for the east-west bracket 100.

Figure 9A:
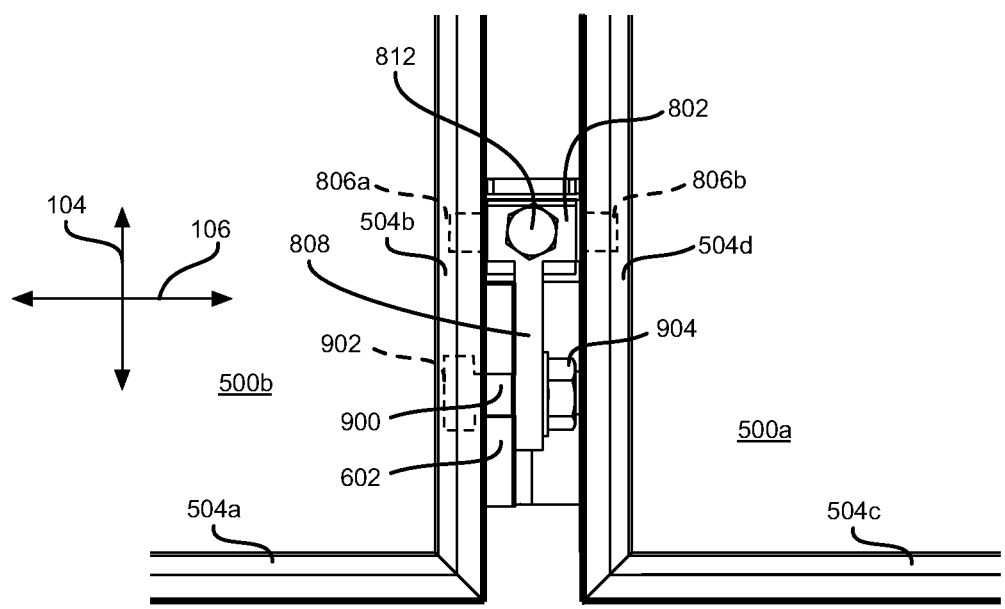
FIGS. 9A through 9C are views of a north-south bracket secured to solar panels in accordance with an embodiment of the present invention.
Figure 9B:
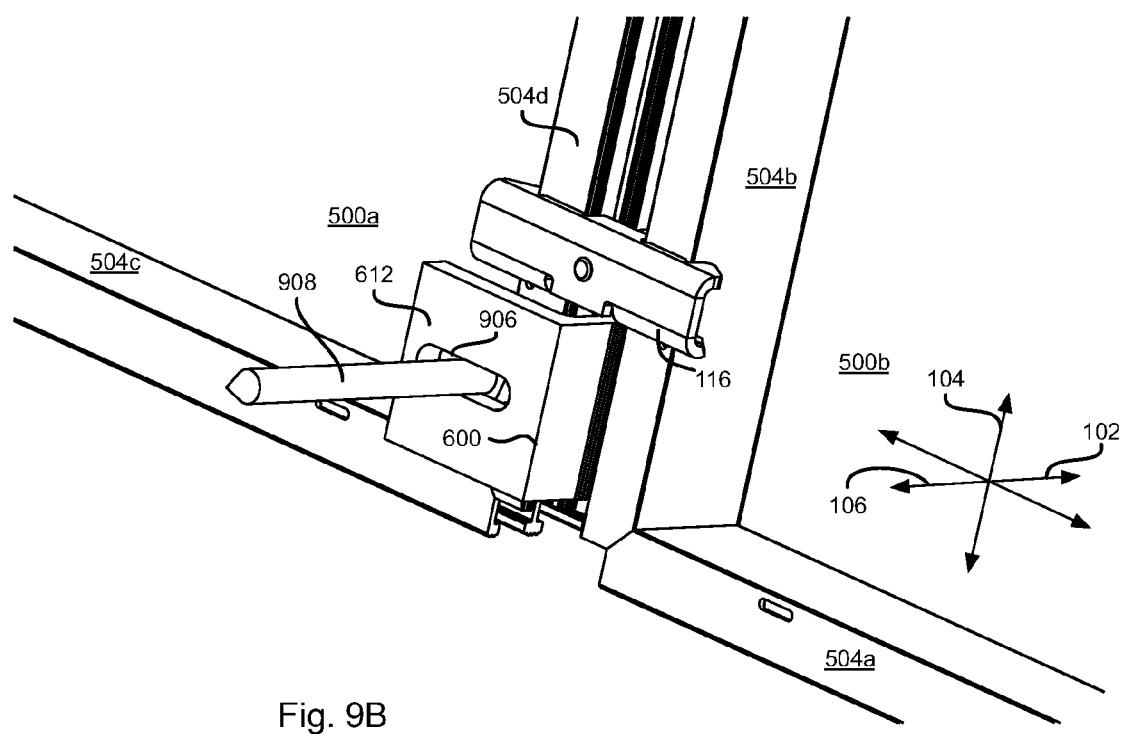

FIGS. 9A and 9B illustrate operation of the north-south spacer 800. The spacer 802 is inserted between solar panels 500*a*, 500*b* having the protuberances 806 inserted within one of the channels 506, 508 of frame portions 504*b*, 504*d*. The clamp 116 may likewise engage the frame portions 504*b*, 504*d* in the same manner as for the east-west bracket 100 having portions of the frame portions 504*b*, 504*d* positioned within the seats 400*a*, 400*b*.

The north-south bracket 800 advantageously enables positioning along various positions along the frame portions 504*b*, 504*d* by sliding the protuberances 806*a*, 806*b* within the channel 506, 508. As noted above, the rafters or other structural member to which a solar panel must secure may be at various locations that do not correspond to the placement of the solar panels 500*a*, 500*b*. Accordingly, the slidability of the north-south bracket may enable securement at various locations in order to accommodate this variability. For example, a bolt 900 may have the head 902 thereof positioned in one of the channels 506, 608 of a frame portion 504*b*, 504*d*. The bolt 900 may pass through the flange 808, such as through the slot 810. A nut 904 may engage the bolt 900. The bolt 900 may also pass through the upper flange 602 of the L-foot 600. Accordingly, tensioning of the nut 904 will fasten the upper leg 602 to the frame portion 504*b*, 504*d*.

Figure 9C:
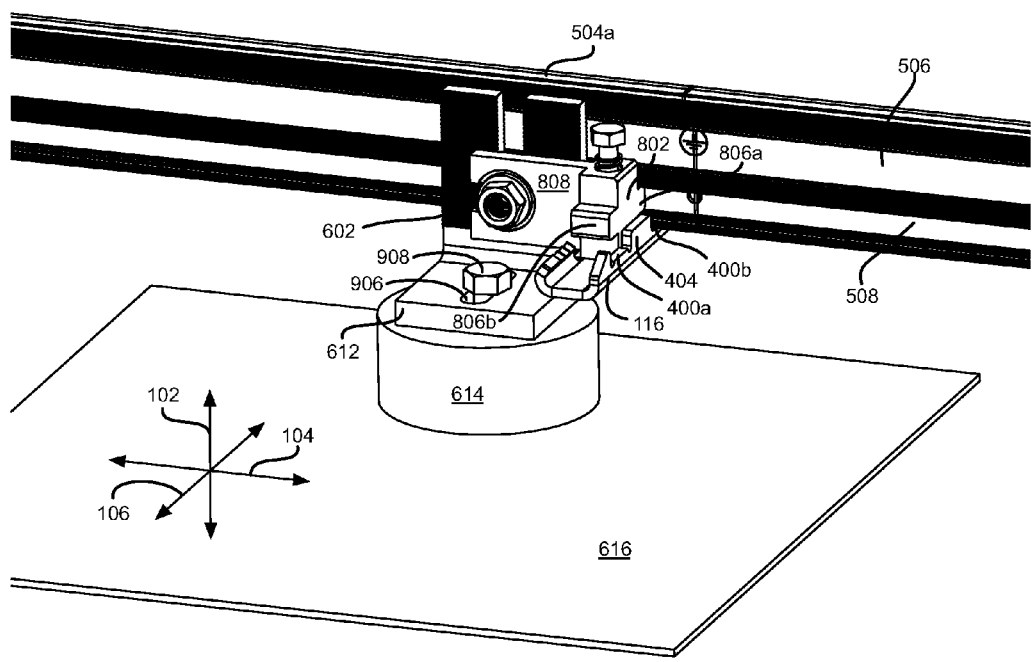

As shown in FIG. 9B, an aperture 906 in the lower flange 612 of the L-foot may receive a lag bolt 908, or some other fastener. As shown in FIG. 9C, the lag bolt 908 may pass through a spacer 614 and/or some other structure 616, such as in the same manner as described above with respect to FIG. 6.

The present invention may be embodied in other specific forms without departing from its spirit or essential characteristics. The described embodiments are to be considered in all respects only as illustrative, and not restrictive. The scope of the invention is, therefore, indicated by the appended claims, rather than by the foregoing description. All changes which come within the meaning and range of equivalency of the claims are to be embraced within their scope.

What is claimed is:

1. An article of manufacture for use in a solar panel installation having at least first and second solar panels, wherein each solar panel comprises a frame encircling a perimeter of the solar panel, a first channel disposed along a portion of the frame and being configured to affix the solar panel to one or more mounting points, and a second channel disposed along one of an internal and external surface of the frame, the second channel configured to retain a widened portion of a fastener positioned within the channel, the article comprising:

an elongated body having a first end, and a second end opposite the first end, each of the respective first and second ends being shaped to match a configuration of the second channel and to be received and retained in the second channel of the respective first solar panel and the second solar panels;

a spacer defining opposing surfaces for engaging the first and second solar panels, a fastener aperture, and a slot having the elongated body positioned within the slot;

a fastener positioned in the fastener aperture; and a clamp secured to the spacer by the fastener and defining first and second seats each configured to receive a lower portion of the frames of the first and second solar panels, respectively;

wherein
the elongated body is slidable through the spacer along a horizontal direction;
the clamp is positioned to exert a clamping force in a vertical direction perpendicular to the horizontal direction; and
the fastener and fastener aperture are offset from the elongated body in a longitudinal direction perpendicular to the horizontal and vertical directions.

2. The article of manufacture of claim 1, wherein the fastener is configured to maintain the first and second seats in engagement with portions of the frames of the first and second solar panels.

3. The article of manufacture of claim 2, wherein the fastener is at least one of a bolt, screw, lynch pin, and detent.

4. The article of manufacture of claim 2, wherein the fastener is spring loaded.

5. The article of manufacture of claim 2, wherein the fastener comprises a bolt engaging the spacer and clamp.

6. The article of manufacture of claim 5, wherein the bolt includes a head and a threaded portion and at least one of:
the clamp is captured between the head and the spacer and the threaded portion threadably engages the spacer; and
the spacer is captured between the head and the clamp and the threaded portion threadably engages one of (a) the clamp and (b) a nut positioned having the clamp positioned between the spacer and the nut.

7. The article of manufacture of claim 6, further comprising a biasing member positioned at least one of between the head and the spacer and between the head and the clamp.

8. The article of manufacture of claim 7, wherein the biasing member is a spring encircling the bolt.

9. The article of manufacture of claim 1, wherein the clamp further defines a scoring member configured to penetrate coatings on frames of the first and second solar panels.

10. The article of manufacture of claim 1, wherein the clamp further defines sloped end portions configured to engage the frame on sliding of the elongated body into the channels of one of the first and second channels of the first and second solar panels.

11. The article of manufacture of claim 1, wherein the first and second seats are sized to permit movement of the portions of the first and second solar frames inserted therein by at least 1 mm.

12. The apparatus of claim 1, wherein the clamp defines a channel and a bottommost surface of the spacer seats within the channel.

13. An article of manufacture for use in a solar panel installatioin having at least first and second solar panels, wherein each solar panel comprises a frame encircling a perimeter of the solar panel, a first channel disposed along a portion of the frame and being configured to affix the solar panel to one or more mounting points, and a second channel disposed along one of an internal and external surface of the frame, the second channel configured to retain a widening portion of a fastener positioned within the channel, the article comprising;
an elongated body having a first end, and a second end opposite the first end, each of the respective first and second ends being shaped to match a configuration of the second channel and to be received and retained in the second channel of the respective first solar panel and the second solar panels;
a spacer defining opposing surfaces for engaging the first and second solar panels, a fastener aperture, and a slot having the elongated body positioned within the slot;
a fastener positioned in the fastener aperture; and
a clamp secured to the spacer by the fastener and defining first and second seats each configured to receive a lower portion of the frames of the first and second solar panels, respectively;
wherein the slot includes a first slot surface and a second slot surface having the elongated body positioned therebetween, the second slot surface being defined on a flexible flange portion of the spacer.

14. The article of manufacture of claim 13, further comprising a fastener selectively securing the elongated body within the slot.

15. The apparatus of claim 14, further comprising a lip secured to the flexible flange portion and extending inwardly into the slot toward the first slot surface, the elongated body defining a notch having the lip inserted therein.

16. An article of manufacture for use in a solar panel installation having at least first and second solar panels, wherein each solar panel comprises a frame encircling a perimeter of the solar panel, a first channel disposed along a portion of the frame and being configured to affix the solar panel to one or more mounting points, and a second channel disposed along one of an internal and external surface of the frame, the second channel configured to retain a widened portion of a fastener positioned within the channel, the article comprising: an elongated body having a first end, and a second end opposite the first end, each of the respective first and second ends being shaped to match a configuration of the 6 a spacer defining opposing surfaces for engaging the first and second solar panels, a fastener aperture, and a slot having the elongated body positioned within the slot, the elongated body being slidable completely through the slot and of sufficient length to extend on either side of the slot when positioned in the slot; a fastener positioned in the fastener aperture; and a clamp secured to the spacer by the fastener and defining first and second seats each configured to receive a lower portion of the frames of the first and second solar panels, respectively.

* * * * *

UNITED STATES PATENT AND TRADEMARK OFFICE
CERTIFICATE OF CORRECTION

| | |
|---|---|
| PATENT NO. | : 9,853,593 B2 |
| APPLICATION NO. | : 14/325058 |
| DATED | : December 26, 2017 |
| INVENTOR(S) | : Cinnamon et al. |

It is certified that error appears in the above-identified patent and that said Letters Patent is hereby corrected as shown below:

In the Claims

Column 11, Line 52-Column 12, Line 24, Approximately, should read:

13. An article of manufacture for use in a solar panel installation having at least first and second solar panels, wherein each solar panel comprises a frame encircling a perimeter of the solar panel, a first channel disposed along a portion of the frame and being configured to affix the solar panel to one or more mounting points, and a second channel disposed along one of an internal and external surface of the frame, the second channel configured to retain a widened portion of a fastener positioned within the channel, the article comprising; an elongated body having a first end, and a second end opposite the first end, each of the respective first and second ends being shaped to match a configuration of the second channel and to be received and retained in the second channel of the respective first solar panel and the second solar panels; a spacer defining opposing surfaces for engaging the first and second solar panels, a fastener aperture, and a slot having the elongated body positioned within the slot; a fastener positioned in the fastener aperture; and a clamp secured to the spacer by the fastener and defining first and second seats each configured to receive a lower portion of the frames of the first and second solar panels, respectively; wherein the slot includes a first slot surface and a second slot surface having the elongated body positioned therebetween, the second slot surface being defined on a flexible flange portion of the spacer.

Signed and Sealed this
Tenth Day of July, 2018

Andrei Iancu
*Director of the United States Patent and Trademark Office*